US010612148B2

(12) United States Patent
Pokhrel

(10) Patent No.: US 10,612,148 B2
(45) Date of Patent: Apr. 7, 2020

(54) COPPER ELECTROPLATING COMPOSITIONS AND METHODS OF ELECTROPLATING COPPER ON SUBSTRATES

(71) Applicant: Rohm and Haas Electronic Materials LLC, Marlborough, MA (US)

(72) Inventor: Ravi Pokhrel, Framingham, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 16/166,217

(22) Filed: Oct. 22, 2018

(65) Prior Publication Data

US 2019/0136396 A1 May 9, 2019

Related U.S. Application Data

(60) Provisional application No. 62/583,120, filed on Nov. 8, 2017.

(51) Int. Cl.

| | |
|---|---|
| C25D 3/38 | (2006.01) |
| C25D 5/02 | (2006.01) |
| C25D 7/00 | (2006.01) |
| H05K 3/18 | (2006.01) |
| H05K 3/40 | (2006.01) |
| H01L 23/00 | (2006.01) |
| H01L 21/768 | (2006.01) |
| H01L 21/288 | (2006.01) |
| H01L 21/027 | (2006.01) |
| H05K 3/10 | (2006.01) |
| H05K 1/09 | (2006.01) |

(Continued)

(52) U.S. Cl.
CPC ............... *C25D 3/38* (2013.01); *C25D 5/022* (2013.01); *C25D 7/00* (2013.01); *H01L 21/0273* (2013.01); *H01L 21/2885* (2013.01); *H01L 21/76879* (2013.01); *H01L 24/03* (2013.01); *H05K 3/108* (2013.01); *H05K 3/188* (2013.01); *H05K 3/4007* (2013.01); *C25D 7/123* (2013.01); *H01L 23/53228* (2013.01); *H01L 2224/03001* (2013.01); *H01L 2224/03462* (2013.01); *H01L 2224/05147* (2013.01); *H05K 1/09* (2013.01); *H05K 2203/0723* (2013.01)

(58) Field of Classification Search
CPC .................................. C25D 3/38; C25D 5/022
USPC .......................... 205/118, 123, 125, 297, 298
See application file for complete search history.

(56) References Cited

U.S. PATENT DOCUMENTS 3,728,115 A * 4/1973 Poot et al. ............. G03C 1/695
430/196
4,522,745 A * 6/1985 Kurkov ................ C08G 61/123
252/500

(Continued)

FOREIGN PATENT DOCUMENTS

| JP | 51-049577 | * 12/1976 | ............. C23C 18/40 |
| JP | 2004-231709 | * 8/2004 | ........... C07D 487/04 |
| JP | 2014185390 A | 10/2014 | |

*Primary Examiner* — Edna Wong
(74) *Attorney, Agent, or Firm* — John J. Piskorski

(57) ABSTRACT

Copper electroplating compositions which include a diimidazole compound enables the electroplating of copper having uniform morphology on substrates. The composition and methods of enable copper electroplating of photoresist defined features. Such features include pillars, bond pads and line space features.

9 Claims, 2 Drawing Sheets

(51) Int. Cl.
*H01L 23/532* (2006.01)
*C25D 7/12* (2006.01)

(56) References Cited

U.S. PATENT DOCUMENTS

| | | | | |
|---|---|---|---|---|
| 6,114,498 A | * | 9/2000 | Tan | C08G 73/0627 528/337 |
| 6,176,984 B1 | * | 1/2001 | Narang | C08G 61/10 204/296 |
| 2011/0220513 A1 | * | 9/2011 | Niazimbetova | C07D 235/08 205/297 |

* cited by examiner

COPPER ELECTROPLATING COMPOSITIONS AND METHODS OF ELECTROPLATING COPPER ON SUBSTRATES

FIELD OF THE INVENTION

The present invention is directed to copper electroplating compositions and methods of electroplating copper on substrates, wherein the copper electroplating compositions include a diimidazole compound to provide copper deposits having uniform morphology. More specifically, the present invention is directed to copper electroplating compositions and methods of electroplating copper on substrates, wherein the copper electroplating compositions include an diimidazole compound to provide copper deposits having uniform morphology and wherein the copper electroplating compositions and copper electroplating methods can be used to electroplate photoresist defined features.

BACKGROUND OF THE INVENTION

Photoresist defined features include copper pillars and redistribution layer wiring such as bond pads and line space features for integrated circuit chips and printed circuit boards. The features are formed by the process of lithography where a photoresist is applied to a substrate such as a semiconductor wafer chip often referred to as a die in packaging technologies, or epoxy/glass printed circuit boards. In general, the photoresist is applied to a surface of the substrate and a mask with a pattern is applied to the photoresist. The substrate with the mask is exposed to radiation such as UV light. Typically the sections of the photoresist which are exposed to the radiation are developed away or removed exposing the surface of the substrate. Depending on the specific pattern of the mask an outline of a circuit line or aperture may be formed with the unexposed photoresist left on the substrate forming the walls of the circuit line pattern or aperture. The surface of the substrate includes a metal seed layer or other conductive metal or metal alloy material which enables the surface of the substrate conductive. The substrate with the patterned photoresist is then immersed in a metal electroplating bath, typically a copper electroplating bath, and metal is electroplated in the circuit line pattern or aperture to form features such as pillars, bond pads or circuit lines, i.e., line space features. When electroplating is complete, the remainder of the photoresist is stripped from the substrate with a stripping solution and the substrate with the photoresist defined features is further processed.

Pillars, such as copper pillars, are typically capped with solder to enable adhesion as well as electrical conduction between the semiconductor chip to which the pillars are plated and a substrate. Such arrangements are found in advanced packaging technologies. Solder capped copper pillar architectures are a fast growing segment in advanced packaging applications due to improved input/output (I/O) density compared to solder bumping alone. A copper pillar bump with the structure of a non-reflowable copper pillar and a reflowable solder cap has the following advantages: (1) copper has low electrical resistance and high current density capability; (2) thermal conductivity of copper provides more than three times the thermal conductivity of solder bumps; (3) can improve traditional BGA CTE (ball grid array coefficient of thermal expansion) mismatch problems which can cause reliability problems; and (4) copper pillars do not collapse during reflow allowing for very fine pitch without compromising stand-off height.

Of all the copper pillar bump fabrication processes, electroplating is by far the most commercially viable process. In the actual industrial production, considering the cost and process conditions, electroplating offers mass productivity and there is no polishing or corrosion process to change the surface morphology of copper pillars after the formation of the copper pillars. Therefore, it is particularly important to obtain a smooth surface morphology by electroplating. The ideal copper electroplating chemistry and method for electroplating copper pillars yields deposits with excellent uniformity, flat pillar shape and void-free intermetallic interface after reflow with solder and is able to plate at high deposition rates to enable high wafer through-out. However, development of such plating chemistry and method is a challenge for the industry as improvement in one attribute typically comes at the expense of another. Copper pillar based structures have already been employed by various manufacturers for use in consumer products such as smart phones and PCs. As Wafer Level Processing (WLP) continues to evolve and adopt the use of copper pillar technology, there will be increasing demand for copper plating baths and methods with advanced capabilities that can produce reliable copper pillar structures.

Similar problems of morphology are also encountered with the metal electroplating of redistribution layer wiring. Defects in the morphology of bond pads and line space features also compromise the performance of advanced packaging articles. Accordingly, there is a need for copper electroplating compositions and copper electroplating methods which provide copper deposits having uniform morphology and which can be used to electroplate copper in the formation of photoresist defined features.

SUMMARY OF THE INVENTION

The present invention includes a composition including one or more sources of copper ions; one or more electrolytes; one or more accelerators; one or more suppressors; and one or more diimidazole compounds having a formula:

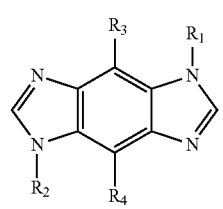

(I)

wherein $R_1$, $R_2$, $R_3$ and $R_4$ are independently chosen from hydrogen; linear or branched $(C_1-C_4)$alkyl; and phenyl.

The present invention further includes a method including:
 a) providing a substrate;
 b) providing a copper electroplating composition including one or more sources of copper ions; one or more electrolytes; one or more accelerators; one or more suppressors; and one or more diimidazole compounds having a formula:

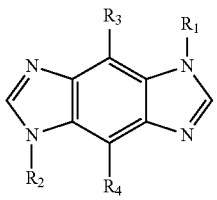

wherein $R_1$, $R_2$, $R_3$ and $R_4$ are independently chosen from hydrogen; linear or branched ($C_1$-$C_4$)alkyl; and phenyl;

c) applying the copper electroplating composition to the substrate; and d) electroplating copper having a uniform morphology on the substrate with the copper electroplating composition.

The copper electroplating compositions of the present invention enable copper deposits having uniform morphology and can be used to copper electroplate photoresist features on substrates. The photoresist features electroplated with the copper electroplating composition and method of the present invention have substantially uniform morphology and are substantially free of nodules. Photoresist features such as copper pillars and bond pads have a substantially flat profile.

DETAILED DESCRIPTION OF THE INVENTION

Figure 1:
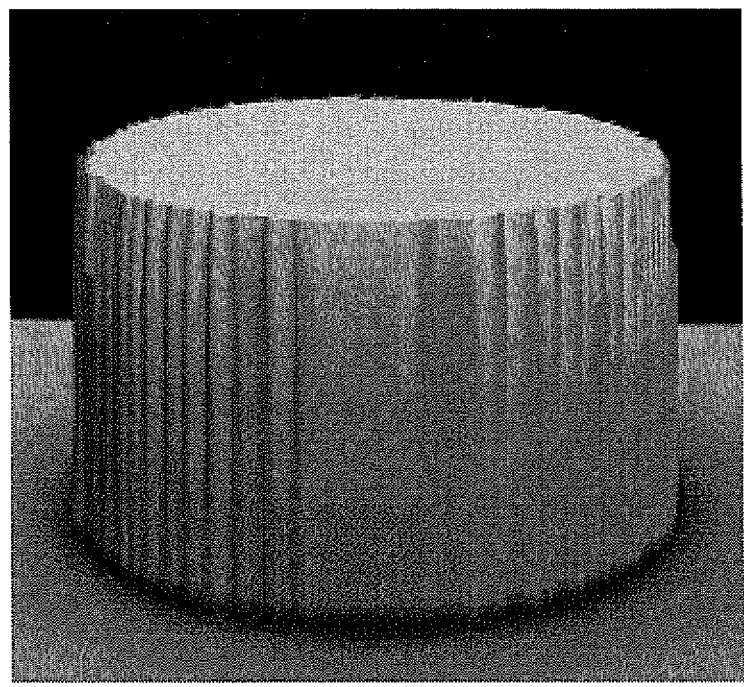
FIG. 1 is a 50× zoomed in 3D image of a 50 μm diameter×30 μm height copper pillar electroplated from a copper electroplating bath of the present invention containing 1,5-dihydrobenzo[1,2-d:4,5-d']diimidazole.

As used throughout this specification the following abbreviations shall have the following meanings unless the context clearly indicates otherwise: A=amperes; A/dm²=amperes per square decimeter=ASD; ° C.=degrees Centigrade; UV=ultraviolet radiation; g=gram; ppm=parts per million=mg/L; L=liter, μm=micron=micrometer; mm=millimeters; cm=centimeters; DI=deionized; mL=milliliter; mol=moles; mmol=millimoles; Mw=weight average molecular weight; Mn=number average molecular weight; 3D=three-dimensional; FIB=focus ion beam; WID=within-die; % WID=a measure of height uniformity of pillars within a die; TIR=total indicated runout=total indicator reading=full indicator movement=FIM; and RDL=redistribution layer.

As used throughout this specification, the term "plating" refers to copper electroplating. "Deposition" and "plating" are used interchangeably throughout this specification. "Accelerator" refers to an organic additive that increases the plating rate of the electroplating bath. "Suppressor" refers to an organic additive that suppresses the plating rate of a metal during electroplating. The term "array" means an ordered arrangement. The term "moiety" means a part of a molecule or polymer that may include either whole functional groups or parts of functional groups as substructures. The terms "moiety" and "group" are used interchangeably throughout the specification. The term "aperture" means opening, hole, or gap. The term "morphology" means the form, shape and structure of an article. The term "total indicator runout" or "total indicator reading" is the difference between the maximum and minimum measurements, that is, readings of an indicator, on planar, cylindrical, or contoured surface of a part, showing its amount of deviation from flatness, roundness (circularity), cylindricity, concentricity with other cylindrical features or similar conditions. The term "profilometry" means the use of a technique in the measurement and profiling of an object or the use of a laser or white light computer-generated projections to perform surface measurements of three dimensional objects. The term "pitch" means a frequency of feature positions from each other on a substrate. The term "average" means a number expressing the central value of a parameter, and the central value is determined by adding the numerical values measured or collected for a particular parameter for a plurality of samples and dividing the sum of the values measured for each sample by the total number of samples. The term "parameter" means a numerical or other measurable factor forming one of a set that defines a system or sets the conditions of its operation. The term "circumference" means the border around a pillar. The term "e.g." means for example. The articles "a" and "an" refer to the singular and the plural.

All numerical ranges are inclusive and combinable in any order, except where it is clear that such numerical ranges are constrained to add up to 100%.

The present invention includes a composition including one or more sources of copper ions; and, corresponding anions of the one or more sources of copper ions (cations); one or more electrolytes; one or more accelerators; one or more suppressors; one or more imidazole compounds having a formula:

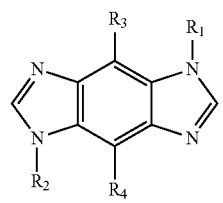

wherein $R_1$, $R_2$, $R_3$ and $R_4$ are independently chosen from hydrogen; linear or branched ($C_1$-$C_4$)alkyl; and phenyl; and the solvent is water. Preferably, $R_1$, $R_2$, $R_3$ and $R_4$ are independently chosen from hydrogen; and linear or branched ($C_1$-$C_4$)alkyl; more preferably, $R_1$, $R_2$, $R_3$ and $R_4$ are independently chosen from hydrogen; and linear ($C_1$-$C_2$) alkyl; even more preferably, $R_1$, $R_2$, $R_3$ and $R_4$ are independently chosen from hydrogen and methyl; most preferably $R_1$, $R_2$, $R_3$ and $R_4$ are hydrogen (1,5-dihydrobenzo[1,2-d:4,5-d']diimidazole). Diimidazole compounds of the present invention have un-quaternized nitrogens. Such compounds can be readily made accordingly the chemical literature or obtained commercially, such as from Sigma-Aldrich, Milwaukee, Wis., USA.

The one or more diimidazole compounds of the present invention can be included in the copper electroplating compositions in sufficient amounts to provide a copper deposit having smooth and uniform surface morphology. Preferably, the one or more diimidazole compounds of the present invention are included in the copper electroplating compositions in amounts of 0.25 mg/L to 1000 mg/L (e.g. 0.5 mg/L to 800 mg/L, or such as from 1 mg/L to 700 mg/L); more preferably, from 10 mg/L to 500 mg/L (e.g. 15 mg/L to 450 mg/L, or such as from 25 mg/L to 250 mg/L); even more preferably from 30 mg/L to 500 mg/L (e.g. 35 mg/L to 400 mg/L, or such as from 40 mg/L to 350 mg/L); most preferably from 40 mg/L to 200 mg/L (e.g. 45 mg/L to 150 mg/L, or such as from 50 mg/L to 100 mg/L), based on the total weight of the copper electroplating composition.

The aqueous copper electroplating compositions include copper ions, from one or more sources, such as water soluble copper salts. Such water soluble copper salts include, but are not limited to, copper sulfate, such as copper sulfate pentahydrate; copper halides such as copper chloride; copper acetate; copper nitrate; copper tetrafluoroborate; copper alkylsulfonates; copper aryl sulfonates; copper sulfamate; copper perchlorate and copper gluconate. Exemplary copper alkane sulfonates include copper ($C_1$-$C_6$)alkane sulfonate and more preferably copper ($C_1$-$C_3$)alkane sulfonate. Preferred copper alkane sulfonates are copper methanesulfonate, copper ethanesulfonate and copper propanesulfonate. Exemplary copper arylsulfonates include, but are not limited to, copper benzenesulfonate and copper p-toluenesulfonate. Mixtures of copper ion sources may be used. Such copper salts are well known to those of skill in the art or can be readily made accordingly the chemical literature or obtained commercially, such as from Sigma-Aldrich. In addition to the copper ions (cations), the copper electroplating compositions include the corresponding anions of the water soluble copper salts. The copper electroplating compositions of the present invention are free of other metals, such as alloying metals, with the exception of unavoidable impurities. One or more water soluble copper salts are included in the copper electroplating compositions of the present invention in amounts to provide a copper deposit having smooth and uniform copper morphology. Preferably, one or more of the copper salts are present in amounts sufficient to provide copper ion concentrations of 30 g/L to 70 g/L of plating solution; more preferably, at concentrations of 40 g/L to 60 g/L.

Electrolytes of the present invention can be alkaline or acidic. Preferably the electrolyte is acidic. Preferably, the pH of the electrolyte is ≤2; more preferably the pH is ≤1. Acidic electrolytes include, but are not limited to, sulfuric acid, acetic acid, fluoroboric acid, alkanesulfonic acids such as methanesulfonic acid, ethanesulfonic acid, propanesulfonic acid and trifluoromethane sulfonic acid, aryl sulfonic acids such as benzenesulfonic acid, p-toluenesulfonic acid, sulfamic acid, hydrochloric acid, hydrobromic acid, perchloric acid, nitric acid, chromic acid and phosphoric acid. Mixtures of acids can be used in the present copper plating compositions. Preferred acids include sulfuric acid, methanesulfonic acid, ethanesulfonic acid, propanesulfonic acid, hydrochloric acid and mixtures thereof. The acids may be present in an amount in the range of 1 to 400 g/L. Electrolytes are generally commercially available from a variety of sources and can be used without further purification.

Optionally, electrolytes of the present invention can contain a source of halide ions. Preferably, chloride ions and bromide ions are used; more preferably, chloride ions are included in the copper electroplating compositions. Exemplary chloride ion sources include copper chloride, sodium chloride, potassium chloride and hydrochloric acid (hydrogen chloride). Sources of bromide ions include sodium bromide, potassium bromide and hydrogen bromide. A wide range of halide ion concentrations may be used in the present invention. Preferably, the halide ion concentration is in the range of 0.5 mg/L to 200 mg/L based on the plating composition; more preferably, form 10 mg/L to 150 mg/L; most preferably, from 50 mg/L to 100 mg/L. Such halide ion sources are generally commercially available and can be used without further purification.

Accelerators (also referred to as brightening agents) include, but are not limited to, N,N-dimethyl-dithiocarbamic acid-(3-sulfopropyl)ester; 3-mercapto-propylsulfonic acid-(3-sulfopropyl)ester; 3-mercapto-propylsulfonic acid sodium salt; carbonic acid, dithio-O-ethylester-S-ester with 3-mercapto-1-propane sulfonic acid potassium salt; bis-sulfopropyl disulfide; bis-(sodium sulfopropyl)-disulfide; 3-(benzothiazolyl-S-thio)propyl sulfonic acid sodium salt; pyridinium propyl sulfobetaine; 1-sodium-3-mercaptopropane-1-sulfonate; N,N-dimethyl-dithiocarbamic acid-(3-sulfoethyl)ester; 3-mercapto-ethyl propylsulfonic acid-(3-sulfoethyl)ester; 3-mercapto-ethylsulfonic acid sodium salt; carbonic acid-dithio-O-ethylester-S-ester with 3-mercapto-1-ethane sulfonic acid potassium salt; bis-sulfoethyl disulfide; 3-(benzothiazolyl-S-thio)ethyl sulfonic acid sodium salt; pyridinium ethyl sulfobetaine; and 1-sodium-3-mercaptoethane-1-sulfonate. Such accelerators are commercially available, such as from Sigma-Aldrich, or can be made according to the chemical literature. Accelerators can be used in a variety of concentrations. Preferably, accelerators are used in amounts of 0.1 mg/L to 1000 mg/L; more preferably, from 0.5 mg/L to 500 mg/L; most preferably from 1 mg/L to 50 mg/L.

Suppressors include, but are not limited to, polypropylene glycol copolymers and polyethylene glycol copolymers, including ethylene oxide-propylene oxide ("EO/PO") copolymers and butyl alcohol-ethylene oxide-propylene oxide copolymers. The weight average molecular weight of the suppressors may range from 800-15000, preferably from 1000 to 15,000. Suppressors are included in amounts of 0.5 g/L to 15 g/L based on the weight of the plating composition; preferably, from 0.5 g/L to 5 g/L.

The copper electroplating compositions can be prepared by combining the components in any order. It is preferred that the inorganic components such as source of copper ions, water, electrolyte and optional halide ion source are first added to the bath vessel, followed by the organic components such as imidazole compounds, accelerator, suppressor, and any other organic component.

Optionally, the aqueous copper electroplating baths can include a conventional leveling agent provided such the leveling agent does not substantially compromise the morphology of the copper deposits. Such leveling agents may include those disclosed in U.S. Pat. No. 6,610,192 to Step et al., U.S. Pat. No. 7,128,822 to Wang et al., U.S. Pat. No. 7,374,652 to Hayashi et al. and U.S. Pat. No. 6,800,188 to Hagiwara et al. Such leveling agents can be included in conventional amounts; however, it is preferred that such leveling agents are excluded from the copper electroplating compositions of the present invention.

Optionally, the copper electroplating compositions of the present invention can include additives such as buffers to assist in maintaining a desired pH; antimicrobial agents; surfactants such as non-ionic, cationic, anionic and zwitterion surfactants; preferably, the surfactants are non-ionic surfactants; and de-foaming agents. Such additives are well known to those of skill in the art and are used in their conventional amounts or minor experimentation can be carried out to determine the optimum concentrations of the additives to be included in the copper electroplating compositions of the present invention.

Preferably, the copper electroplating compositions consist of one or more sources of copper ions; and, corresponding anions of the one or more sources of copper ions (cations); one or more electrolytes; one or more accelerators; one or more suppressors; one or more diimidazole compounds having formula (I); water; and, optionally, one or more sources of halide ions; and one or more additives chosen from buffers, antimicrobial agents, surfactants, and de-foaming agents.

More preferably, the copper electroplating compositions consist of one or more sources of copper ions; and, corresponding anions of the one or more sources of copper ions (cations); one or more electrolytes; one or more accelerators; one or more suppressors; 1,5-dihydrobenzo[1,2-d:4,5-d'] diimidazole; water; and, optionally, one or more sources of halide ions; and one or more additives chosen from buffers, antimicrobial agents, surfactants, and de-foaming agents.

The copper electroplating compositions of the present invention can be used to electroplate copper at temperatures of 10° C. to 65° C. Preferably, the temperature of the plating composition is from 15 to 50° C.; more preferably from room temperature to 40° C.

Preferably, the copper electroplating compositions are agitated during plating. Any suitable agitation method can be used. Methods of agitating are well-known in the art. Such agitation methods include, but are not limited to, air sparging, work piece agitation, and impingement.

A substrate can be electroplated with copper by contacting the substrate with the copper electroplating composition of the present invention. The substrate can function as a cathode. The anode can be a soluble anode, such as a copper anode, or an insoluble anode. Various insoluble anodes are known to those of skill in the art. Electrical potential is applied to the electrodes. Current densities can range from 0.25 ASD to 40 ASD; preferably, 1 ASD to 30 ASD; more preferably, from 10 ASD to 30 ASD.

The copper electroplating compositions and methods of the present invention can be used to plate copper having a smooth and uniform morphology on various substrates where smooth and uniform morphology copper deposits are desired; however, the copper electroplating compositions and methods are preferably used to plate photoresist defined features.

Methods and compositions for electroplating copper photoresist defined features of the present invention enable an array of photoresist defined features having an average TIR such that the features have a morphology which is substantially smooth, free of nodules and with respect to pillars, bond pads and line space features have substantially flat profiles. The photoresist defined features of the present invention are electroplated with photoresist remaining on the substrate and extend beyond the plane of the substrate. This is in contrast to dual damascene and printed circuit board plating which do not use photoresist to define features which extend beyond the plane of the substrate but are inlaid into the substrate. An important difference between photoresist defined features and damascene and printed circuit board features is that with respect to the damascene and printed circuit boards the plating surface including the sidewalls are all conductive. The dual damascene and printed circuit board plating baths have a bath formulation that provides bottom-up or super-conformal filling, with the bottom of the feature plating faster than the top of the feature. In photoresist defined features, the sidewalls are non-conductive photoresist and plating only occurs at the feature bottom with the conductive seed layer and proceeds in a conformal or same plating speed everywhere deposition.

While the present invention is substantially described with respect to methods of electroplating copper pillars having a circular morphology, the present invention also applies to other photoresist defined features such as bond pads and line space features. In general, the shapes of the features may be, for example, oblong, octagonal and rectangular in addition to circular or cylindrical. The methods of the present invention are preferably for electroplating copper cylindrical pillars, wherein the pillars have a substantially flat top.

The copper electroplating methods provide an array of copper photoresist defined features, such as copper pillars, with an average TIR of −3 to 3; preferably, from −2 to 2; more preferably from −2 to 1; most preferably from −2 to −1.

The average TIR for an array of photoresist defined features on a substrate involves determining the TIR of individual features from the array of features on the single substrate and averaging them. The average TIR for features of a given substrate can be determined by determining the TW for individual features of a region of low density, medium density or high density pitch, or combinations thereof, adding the measured values and averaging the values. By measuring the TIR of a variety of individual features, the average TIR becomes representative of the whole substrate.

Individual feature TIRs may be determined by the following equation:

$$TIR = height_{center} - height_{edge},$$

where $height_{center}$ is the height of a pillar as measured along its center axis and $height_{edge}$ is the height of the pillar as measured along its edge at the highest point on the edge.

In addition, the copper electroplating methods and compositions can provide an array of copper photoresist defined features with a % WID of 0% to 16%; preferably, from 5% to 16%; more preferably, from 12% to 16%; most preferably, from 14% to 16%. The % WID or within-die can be determined by the following equation:

$$\% \text{ WID} = \frac{1}{2} \times [(height_{max} - height_{min})/height_{avg}] \times 100$$

where $height_{max}$ is the height of the tallest pillar of an array of pillars electroplated on a substrate as measured at the tallest part of the pillar. $Height_{min}$ is the height of the shortest pillar of an array of pillars electroplated on the substrate as measured at the tallest part of the pillar. $Height_{avg}$ is the average height of all of the pillars electroplated on the substrate. Most preferably, the copper electroplating compositions and methods of the present invention provide an array of photoresist defined features on a substrate where there is a balance between the average TIR and % WID such that the average TIR ranges from −3 to 3 and the % WID ranges from 0% to 16% with the preferred ranges for each parameter as disclosed above.

The parameters of the pillars for determining TIR and % WID may be measured using optical profilometry such as with a KEYENCE 3D Laser Scanning Confocal Microscope VK-X Series or similar apparatus such as a white light LEICA DCM 3D. Parameters such as pillar height and pitch may be measured using such devices.

The copper pillars electroplated from the copper electroplating compositions of the present invention can have aspect ratios of 3:1 to 1:1 or such as 2:1 to 1:1. RDL type structure may have aspect ratios as large as 1:20 (height: width).

While the method of the present invention may be used to electroplate photoresist defined features such as pillars, bonding pads and line space features, the method is described in the context of plating copper pillars which is the preferred feature of the present invention. The copper pillars of the present invention can be formed by first depositing a conductive seed layer on a substrate such as a semiconductor chip or die. The substrate is then coated with a photoresist material and imaged to selectively expose the photoresist layer to radiation, such as UV radiation. The photoresist layer may be applied to a surface of the semiconductor chip by conventional processes known in the art. The thickness of the photoresist layer may vary depending on the height of the features. The thickness can range from 1 μm to 350 μm; preferably, from 10 μm to 230 μm; more preferably, from 20 μm to 220 μm. A patterned mask is applied to a surface of the photoresist layer. The photoresist layer may be a positive or negative acting photoresist. When the photoresist is positive acting, the portions of the photoresist exposed to the radiation are removed with a developer such as an alkaline developer. A pattern of a plurality of apertures such as vias is formed on the surface which reaches all the way down to the seed layer on the substrate or die. The pitch of the pillars can range from 20 μm to 400 μm; preferably, the pitch may range from 100 μm to 350 μm; more preferably, the pitch of the pillars can range from 100 μm to 250 μm. The diameters of the vias can vary depending on the diameters of the features (pillars). The diameters of the vias can range from 2 μm to 300 μm; preferably, from 5 μm to 225 μm; more preferably, from 15 μm to 200 μm. The entire structure can then be placed in a copper electroplating composition of the present invention. Electroplating is done to fill at least a portion of each via with a copper pillar with a substantially flat top. The electroplating is conformal or same plating speed everywhere deposition, not super-conformal or super-filling. The entire structure with the copper pillars is then transferred to a bath containing solder, such as a tin solder or tin alloy solder such as a tin/silver or tin/lead alloy and a solder bump is electroplated on the substantially flat surface of each copper pillar to fill portions of the vias. The remainder of the photoresist is removed by conventional means known in the art leaving an array of copper pillars with solder bumps on the die. The remainder of the seed layer not covered by pillars is removed through etching processes well known in the art. The copper pillars with the solder bumps are placed in contact with metal contacts of a substrate such as a printed circuit board, another wafer or die or an interposer which can be made of organic laminates, silicon or glass. The solder bumps are heated by conventional processes known in the art to reflow the solder and join the copper pillars to the metal contacts of the substrate. Conventional reflow processes for reflowing solder bumps can be used. An example of a reflow oven is FALCON 8500 tool from Sikiama International, Inc. which includes 5 heating and 2 cooling zones. Reflow cycles may range from 1-5. The copper pillars are both physically and electrically contacted to the metal contacts of the substrate. An underfill material may then be injected to fill space between the die, the pillars and the substrate. Conventional underfills which are well known in the art can be used.

Figure 2:
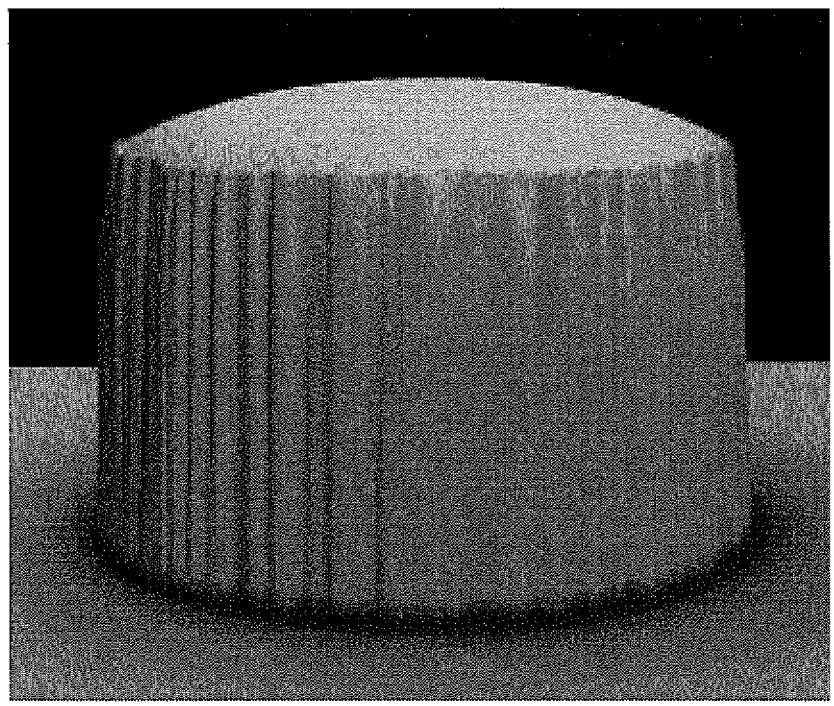
FIG. 2 is a 50× zoomed in 3D image of a 50 μm diameter×30 μm height copper pillar electroplated from a comparative copper electroplating bath containing 3,3'-(ethane-1,2-diyl)bis(1-(2-hydroxyethyl)-1H-imidazol-3-ium) chloride.

FIG. 1 is a 3D image collected using a KEYENCE 3D Laser Scanning Confocal Microscope VK-X Series of a copper pillar of the present invention having cylindrical morphology with a base and flat top surface morphology for electroplating solder bumps. During reflow solder is melted to obtain a smooth surface. If pillars are too domed during reflow, the solder may melt and flow off the sides of the pillar and then there is not enough solder on the top of the pillar for subsequent bonding steps, as shown in FIG. 2 which was also a 3D image as FIG. 1. If the pillar is too dished, or has a sink-hole type configuration, material left from the copper bath which was used to electroplate the pillar can be retained in the dished top and contaminate the solder bath, thus shortening the life of the solder bath.

To provide a metal contact and adhesion between the copper pillars and the semiconductor die during electroplating of the pillars, an underbump metallization layer typically composed of a material such as titanium, titanium-tungsten or chromium is deposited on the die. Alternatively, a metal seed layer, such as a copper seed layer, may be deposited on the semiconductor die to provide metal contact between the copper pillars and the semiconductor die. After the photosensitive layer has been removed from the die, all portions of the underbump metallization layer or seed layer are removed except for the portions underneath the pillars. Conventional processes known in the art can be used.

While the height of the copper pillars can vary, they preferably, range in height from 1 μm to 300 μm; more preferably, from 5 μm to 225 μm; even more preferably from 15 μm to 200 μm. Diameters of the copper pillars can also vary. Preferably, the copper pillars have a diameter of 2 μm to 300 μm; more preferably, from 5 μm to 225 μm; even more preferably, 15 μm to 200 μm.

The copper electroplating methods and compositions provide copper photoresist defined features which have a substantially uniform morphology and are substantially free of nodules. The copper pillars and bond pads have a substantially flat profile. The copper electroplating composition and methods enable an average TIR to achieve the desired morphology as well as a balance between an average TW and % WID.

The following examples are intended to further illustrate the invention but are not intended to limit its scope.

Example 1 (Invention)

Copper Electroplating Bath

The following copper electroplating bath of the present invention was prepared with the components and amounts as disclosed in Table 1 below.

TABLE 1

| COMPONENT | AMOUNT |
|---|---|
| Copper ions from copper sulfate pentahydrate | 50 g/L |
| 1,5-dihydrobenzo[1,2-d:4,5-d']diimidazole | 50 mg/L |
| Sulfuric acid (98%) | 100 g/L |
| Chloride ions from hydrogen chloride | 90 mg/L |
| bis-(sodium sulfopropyl)-disulfide | 6 mg/L |
| EO/PO copolymer having a weight average molecular weight of 1,000 and terminal hydroxyl groups | 0.5 g/L |
| Water | To one liter |

The components of the copper electroplating bath were mixed together at room temperature with stirring. The pH of the copper electroplating bath was <1.

Example 2 (Comparative with Quaternized Nitrogens)

Synthesis of 3,3'-(ethane-1,2-diyl)bis(1-(2-hydroxyethyl)-1H-imidazol-3-ium) chloride N-(2-Hydroxyethyl)imidazole (2.55 g, 22.7 mmol) and 1,2-dichloroethane (1.00 g, 10.11 mmol) were weighed into a 20-mL pressure tube. Acetonitrile (10 mL) was added, the tube was sealed and heated to 90° C. for 60 hours. Cooled to room temperature and the resulting precipitate was isolated by filtration, washed with fresh acetonitrile, and dried in vacuo, giving 2.91 g (59%) of the compound as a white powder.

1H NMR (400 MHz, DMSO-d6) δ 9.37 (s, 2H), 7.79 (s, 4H), 5.50 (t, J=5.5 Hz, 2H), 4.81 (s, 4H), 4.23 (t, J=4.6 Hz, 4H), 3.70 (t, J=5.2 Hz, 4H). 13C NMR (101 MHz, DMSO-d6) δ 136.96, 123.06, 122.28, 59.08, 51.84, 48.30.

Example 3 (Comparative)

Copper Electroplating Bath

The following copper electroplating bath of the present invention was prepared with the components and amounts as disclosed in Table 2 below.

TABLE 2

| COMPONENT | AMOUNT |
|---|---|
| Copper ions from copper sulfate pentahydrate | 50 g/L |
| 3,3'-(ethane-1,2-diyl)bis(1-(2-hydroxyethyl)-1H-imidazol-3-ium) chloride | 300 mg/L |
| Sulfuric acid (98%) | 100 g/L |
| Chloride ions from hydrogen chloride | 90 mg/L |
| bis-(sodium sulfopropyl)-disulfide | 6 mg/L |
| EO/PO copolymer having a weight average molecular weight of 1,000 and terminal hydroxyl groups | 0.5 g/L |
| Water | To one liter |

The components of the copper electroplating bath were mixed together at room temperature with stirring. The pH of the copper electroplating bath was <1.

Example 4 (Invention)

A 300 mm silicon wafer die with two different pitch areas (dense pitch=100 μm, and sparse pitch=250 μm), wherein each area had patterned photoresist 50 μm thick and a plurality of apertures with diameters of 50 μm in each area (available from IMAT, Inc., Vancouver, Wash.) was immersed in the copper electroplating bath of the present invention as disclosed in Table 1 of Example 1. The anode was a soluble copper electrode. The wafer and the anode were connected to a rectifier and copper pillars were electroplated on the exposed seed layer at the bottom of the apertures. Average current density during plating was 15 ASD and the temperature of the copper electroplating bath was at 25° C. The pH of the plating bath was <1. After electroplating the remaining photoresist was then stripped with BPR photostripper solution available from the Dow Chemical Company leaving an array of copper pillars on the wafer in the two different pitch areas. Eight copper pillars from each area were then analyzed for their morphology. The heights at the center and edge of the copper pillars and TIR of the pillars were measured using a KEYENCE 3D Laser Scanning Confocal Microscope VK-X Series. The TIR was determined by the following equation:

$$TIR = height_{center} - height_{edge}$$

The average TW of the eight pillars was also determined as shown in the Table 3.

TABLE 3

| Pillar # | Variable Pitches (μm) | Pillar Height$_{max}$ (μm) | Pillar TIR for Each Pillar# (μm) |
|---|---|---|---|
| 1 | 100 | 36.0 | −1.2 |
| 2 | 100 | 30.5 | −1.6 |
| 3 | 100 | 28.9 | −1.6 |
| 4 | 100 | 27.2 | −1.6 |
| 5 | 100 | 27.6 | −1.7 |
| 6 | 250 | 36.9 | −1.4 |
| 7 | 250 | 35.3 | −1.4 |
| 8 | 250 | 31.3 | −1.8 |
| Average | — | 31.7 | −1.6 |

The % WID for the array of pillars was determined with a KEYENCE 3D Laser Scanning Confocal Microscope VK-X Series and the following equation:

$$\% \ WID = \frac{1}{2} \times [(height_{max} - height_{min})/height_{avg}] \times 100$$

The % WID across the dense and the sparse pitches (i.e. 8 pillars measured across the dense and sparse pitches) was 15.4% and the average TIR was −1.6. The surface of the pillars all appeared smooth and free of nodules. The copper electroplating bath which included reaction product 1 plated very good copper pillars. FIG. 1 is an image of pillar 4 from pitch 100 μm plated on a seed layer and analyzed using the 3D image collected using a KEYENCE 3D Laser Scanning Confocal Microscope VK-X Series. The surface morphology was smooth and flat on top suitable for receiving solder.

Example 5 (Comparative)

A 300 mm silicon wafer die with two different pitch areas (dense pitch=100 μm, and sparse pitch=250 μm), wherein each area had patterned photoresist 50 μm thick and a plurality of apertures with diameters of 50 μm in each area (available from IMAT, Inc., Vancouver, Wash.) was immersed in the comparative copper electroplating bath as disclosed in Table 2 of Example 3 with the quaternized nitrogen compound. The anode was a soluble copper electrode. The wafer and the anode were connected to a rectifier and copper pillars were electroplated on the exposed seed layer at the bottom of the apertures. Average current density during plating was 15 ASD and the temperature of the copper electroplating bath was at 25° C. The pH of the plating bath was <1. After electroplating the remaining photoresist was then stripped with BPR photostripper solution available from the Dow Chemical Company leaving an array of copper pillars on the wafer in the two different areas. Eight copper pillars from each area were then analyzed for their morphology. The heights at the center and edge of the copper pillars and TIR of the pillars were measured using a KEYENCE 3D Laser Scanning Confocal Microscope VK-X Series. The TIR was determined by the following equation:

$$TIR = height_{center} - height_{edge}$$

The average TIR of the eight pillars was also determined as shown in the Table 3.

TABLE 3

| Pillar # | Variable Pitches (μm) | Pillar Height$_{max}$ (μm) | Pillar TIR for Each Pillar# (μm) |
|---|---|---|---|
| 1 | 100 | 39.4 | 5.3 |
| 2 | 100 | 32.6 | 3.9 |
| 3 | 100 | 31.4 | 4.2 |
| 4 | 100 | 29.0 | 3.6 |
| 5 | 100 | 29.6 | 4.3 |
| 6 | 250 | 41.4 | 4.6 |

TABLE 3-continued

| Pillar # | Variable Pitches (μm) | Pillar Height$_{max}$ (μm) | Pillar TIR for Each Pillar# (μm) |
|---|---|---|---|
| 7 | 250 | 39.3 | 4.7 |
| 8 | 250 | 34.4 | 4.5 |
| Average | — | 34.6 | 4.4 |

The % WID for the array of pillars was determined with a KEYENCE 3D Laser Scanning Confocal Microscope VK-X Series and the following equation:

% WID=½×[(height$_{max}$−height$_{min}$)/height$_{avg}$]×100

The % WID across dense and sparse pitches was 17.9% (i.e. 8 pillars measured across the dense and sparse pitches) and the average TIR was +4.4. The tops of the pillars appeared domed and rough, thus unsuitable for receiving solder. FIG. 2 is an image of pillar 5 from pitch 100 μm plated on a seed layer and analyzed using the 3D image collected with a KEYENCE 3D Laser Scanning Confocal Microscope VK-X Series. The surface morphology of the circumference of the pillar appeared smooth; however, the top was rounded and rough and unsuitable for receiving solder.

What is claimed is:

1. A composition comprising one or more sources of copper ions, one or more electrolytes, one or more accelerators, one or more suppressors, and one or more imidazole compounds having a formula:

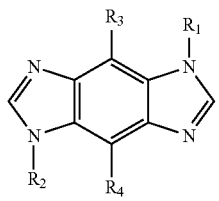

(I)

wherein $R_1$, $R_2$, $R_3$ and $R_4$ are independently chosen from hydrogen, linear or branched $(C_1-C_4)$alkyl, and phenyl.

2. The composition of claim 1, wherein the one or more imidazole compounds are in amounts of 0.25 ppm to 1000 ppm.

3. The composition of claim 1, wherein $R_1$, $R_2$, $R_3$ and $R_4$ are independently chosen from hydrogen, and $(C_1-C_2)$alkyl.

4. The composition of claim 3, wherein $R_1$, $R_2$, $R_3$ and $R_4$ are independently chosen from hydrogen, and methyl.

5. A method comprising:
a) providing a substrate,
b) providing a copper electroplating composition comprising one or more sources of copper ions, one or more electrolytes, one or more accelerators, one or more suppressors, and one or more imidazole compounds having a formula:

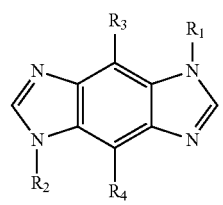

(I)

wherein $R_1$, $R_2$, $R_3$ and $R_4$ are independently chosen from hydrogen, linear or branched $(C_1-C_4)$alkyl, and phenyl,
c) applying the copper electroplating composition to the substrate, and
d) electroplating copper having a uniform morphology on the substrate with the copper electroplating composition.

6. The method of claim 5, wherein the substrate comprises photoresist defined features and the photoresist defined features are electroplated with copper during electroplating.

7. The method of claim 6, wherein the photoresist defined features on the substrate are chosen from one or more of pillars, bond pads and line space features.

8. The method of claim 5, wherein the one or more imidazole compounds are in amounts of 0.25 ppm to 1000 ppm.

9. The method of claim 5, wherein electroplating is done at a current density of 0.25 ASD to 40 ASD.

* * * * *